(12) United States Patent
Huang

(10) Patent No.: US 7,403,059 B2
(45) Date of Patent: Jul. 22, 2008

(54) BASELINE WANDERING CORRECTION DEVICE AND METHOD

(75) Inventor: Chen-Chih Huang, Hsin-Chu Hsien (TW)

(73) Assignee: Realtek Semiconductor Corp., HsinChu (TW)

(*) Notice: Subject to any disclaimer, the term of this patent is extended or adjusted under 35 U.S.C. 154(b) by 195 days.

(21) Appl. No.: 11/306,558

(22) Filed: Jan. 3, 2006

(65) Prior Publication Data
US 2006/0197575 A1 Sep. 7, 2006

(30) Foreign Application Priority Data
Jan. 3, 2005 (TW) .............................. 94100057 A

(51) Int. Cl.
*H03L 5/00* (2006.01)
(52) U.S. Cl. ...................................... 327/307; 375/317
(58) Field of Classification Search ................. 327/307; 375/317, 318, 319
See application file for complete search history.

(56) References Cited

U.S. PATENT DOCUMENTS 6,433,608 B1 8/2002 Huang
2002/0181601 A1 12/2002 Huang et al.

*Primary Examiner*—Tuan T. Lam
*Assistant Examiner*—Diana J Cheng
(74) *Attorney, Agent, or Firm*—Winston Hsu

(57) ABSTRACT

A baseline wandering correction device for correcting baseline wandering of signals at a first output terminal and a second output terminal of a receiver includes: a control circuit for outputting a control signal according to voltages of the first and the second output terminals and a second threshold value; a voltage generation unit coupled to the control circuit for outputting a control voltage according to the control signal, the voltages of the first and the second output terminals, and a first threshold value; and a compensation current source coupled to the voltage generation unit for outputting a compensation current to the receiver according to the control voltage to correct the baseline wandering.

20 Claims, 10 Drawing Sheets

BASELINE WANDERING CORRECTION DEVICE AND METHOD

BACKGROUND OF THE INVENTION

1. Field of the Invention

The present invention relates to network communications, and more particularly, to baseline wandering correction.

2. Description of the Prior Art

The phenomenon of baseline wandering at a receiver, in the context of Ethernet network communications or the like, has existed for a long time. It is a problem that those skilled in the art continue trying to resolve. Please refer to Taiwan Patent No. 497,334, Taiwan Patent No. 545,016, and U.S. Pat. No. 6,433,608 for related technology information on baseline wandering correction, the contents of all of which are incorporated herein by reference.

According to U.S. Pat. No. 6,433,608, if the goal of baseline wandering correction is to be achieved, certain conditions described by the following equations should be satisfied:

$$\begin{cases} \dfrac{R_o}{2L} = \dfrac{1}{R_x C} & (1) \\ 4R(gmx)I_c = \dfrac{V}{R_x} & (2) \end{cases}$$

where definitions of related parameters and derivations of the equations have been disclosed and therefore can be found in U.S. Pat. No. 6,433,608. Detailed explanations are thus not repeated herein for brevity.

However, as the parameters L and Ro in equation (1) respectively represent an inductance value of a transformer and a resistance value of a matching resistor, and as the transformer and the matching resistor are stand-alone components, it is difficult to accurately control values of the parameters L and Ro, and especially the value of the parameter L. When the parameter L or the parameter Ro deviates from nominal value for any particular reason, such variation of manufacturing process or ambient temperature, the condition described by equation (1) becomes difficult to maintain, and therefore the baseline wandering phenomenon can not be effectively corrected.

SUMMARY OF THE INVENTION

It is an objective of the claimed invention to provide baseline wandering correction devices and methods to alleviate the above-mentioned influences from process variation or temperature variation.

It is an objective of the claimed invention to provide baseline wandering correction devices and methods to correct baseline wandering in a real time fashion.

According to one embodiment of the claimed invention, a baseline wandering correction device for correcting baseline wandering of signals at a first output terminal and a second output terminal of a receiver is disclosed. The baseline wandering correction device comprises: a control circuit for outputting a control signal according to voltages of the first and the second output terminals and a second threshold value; a voltage generation unit coupled to the control circuit for outputting a control voltage according to the control signal, the voltages of the first and the second output terminals, and a first threshold value; and a compensation current source coupled to the voltage generation unit for outputting a compensation current to the receiver according to the control voltage to correct the baseline wandering.

According to one embodiment of the claimed invention, a baseline wandering correction method for correcting baseline wandering of signals at a first output terminal and a second output terminal of a receiver is disclosed. The baseline wandering correction method comprises: outputting a control signal according to voltages of the first and the second output terminals and a second threshold value; outputting a control voltage according to the control signal, the voltages of the first and the second output terminals, and a first threshold value; and outputting a compensation current to the receiver according to the control voltage to correct the baseline wandering.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
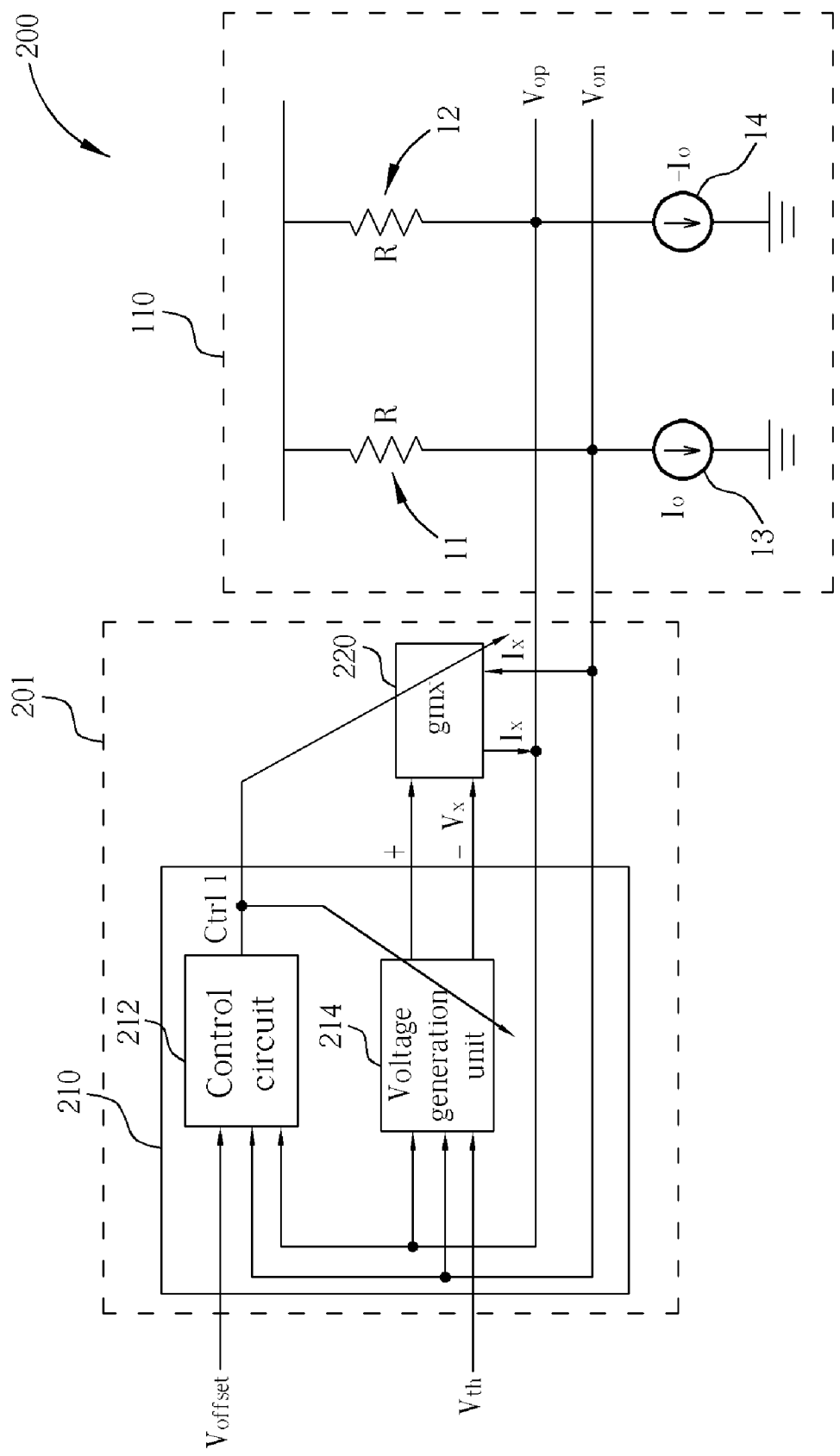
FIG. 1 is a schematic view of a receiving device according to one embodiment of the present invention.

Please refer to FIG. 1. FIG. 1 is a schematic view of a receiving device 200 according to one embodiment of the present invention, where operation of the receiver 110 is well known in the art, such as those described in U.S. Pat. No. 6,433,608, and therefore is not explained in detail herein. As shown in FIG. 1, the receiving device 200 comprises a baseline wandering correction device 201 comprising a voltage signal generator 210 and a compensation current source 220. The voltage signal generator 210 comprises a control circuit 212 and a voltage generation unit 214, where the control circuit 212 outputs a control signal Ctrl1 to the voltage generation unit 214 and the compensation current source 220 according to a threshold value, which is a reference voltage Voffset in this embodiment, and according to voltages of output terminals Vop and Von of the receiver 110, and in particular, variations of the voltages of the output terminals Vop and Von. The voltage generation unit 214 outputs a control voltage Vx to the compensation current source 220 according to the control signal Ctrl1, the variations of the voltages of the output terminals Vop and Von of the receiver 110, and another threshold value, which is another reference voltage Vth in this embodiment. The compensation current source 220 then outputs a compensation current Ix to the receiver 110 according to the control signal Ctrl1 and the control voltage Vx to correct the baseline wandering.

In this embodiment, in order to satisfy the conditions described by equations (1) and (2) mentioned above to effectively correct the baseline wandering phenomenon, the control circuit 212 adjusts parameter(s) of at least one of the components in the voltage generation unit 214 and a transconductance value gmx of the compensation current source 220 by utilizing the control signal Ctrl1, to control the compensation current Ix outputted by the compensation current source 220.

Figure 2:
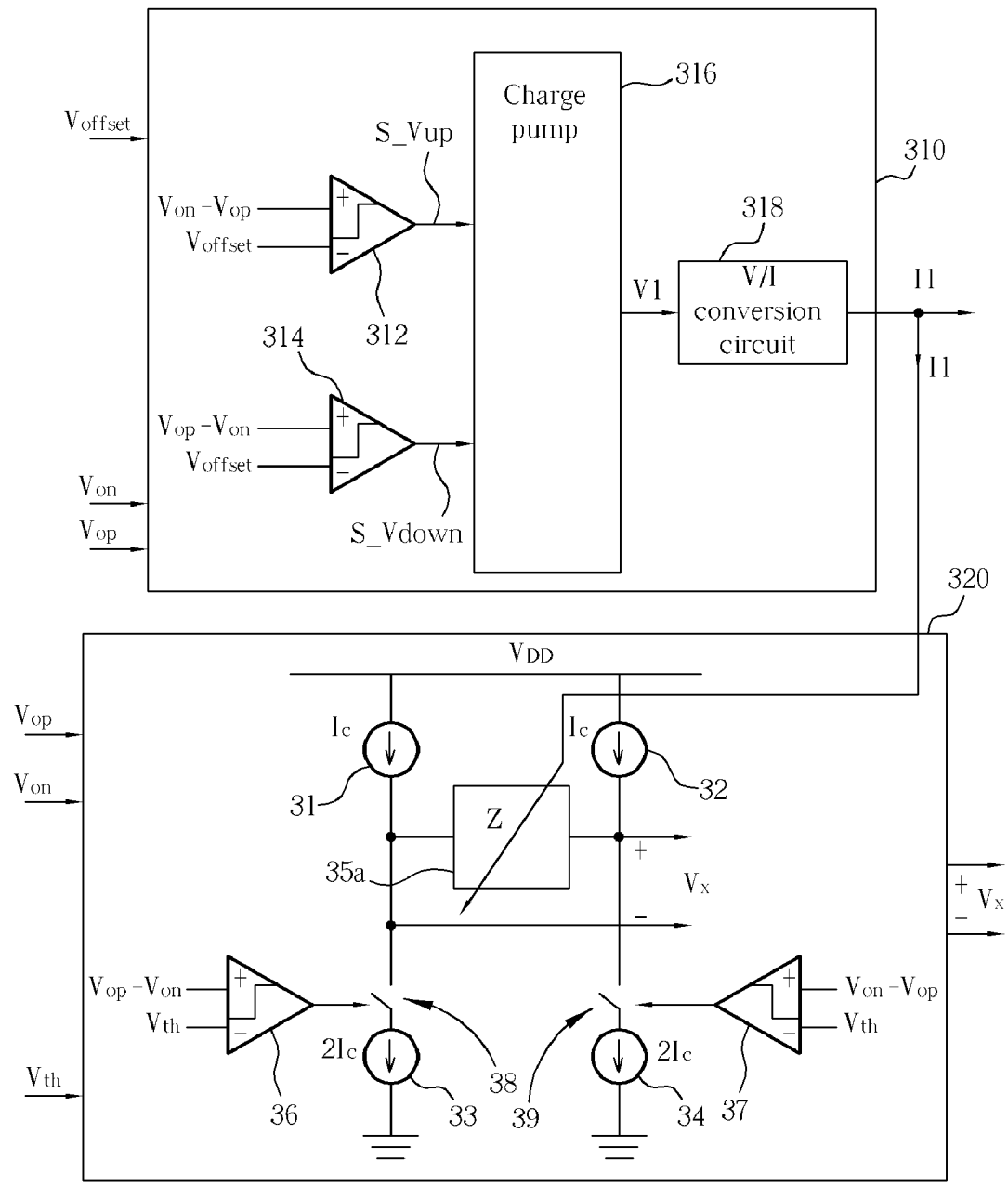
FIG. 2 is a diagram of a voltage signal generator according to one embodiment of the present invention.
Figure 3:
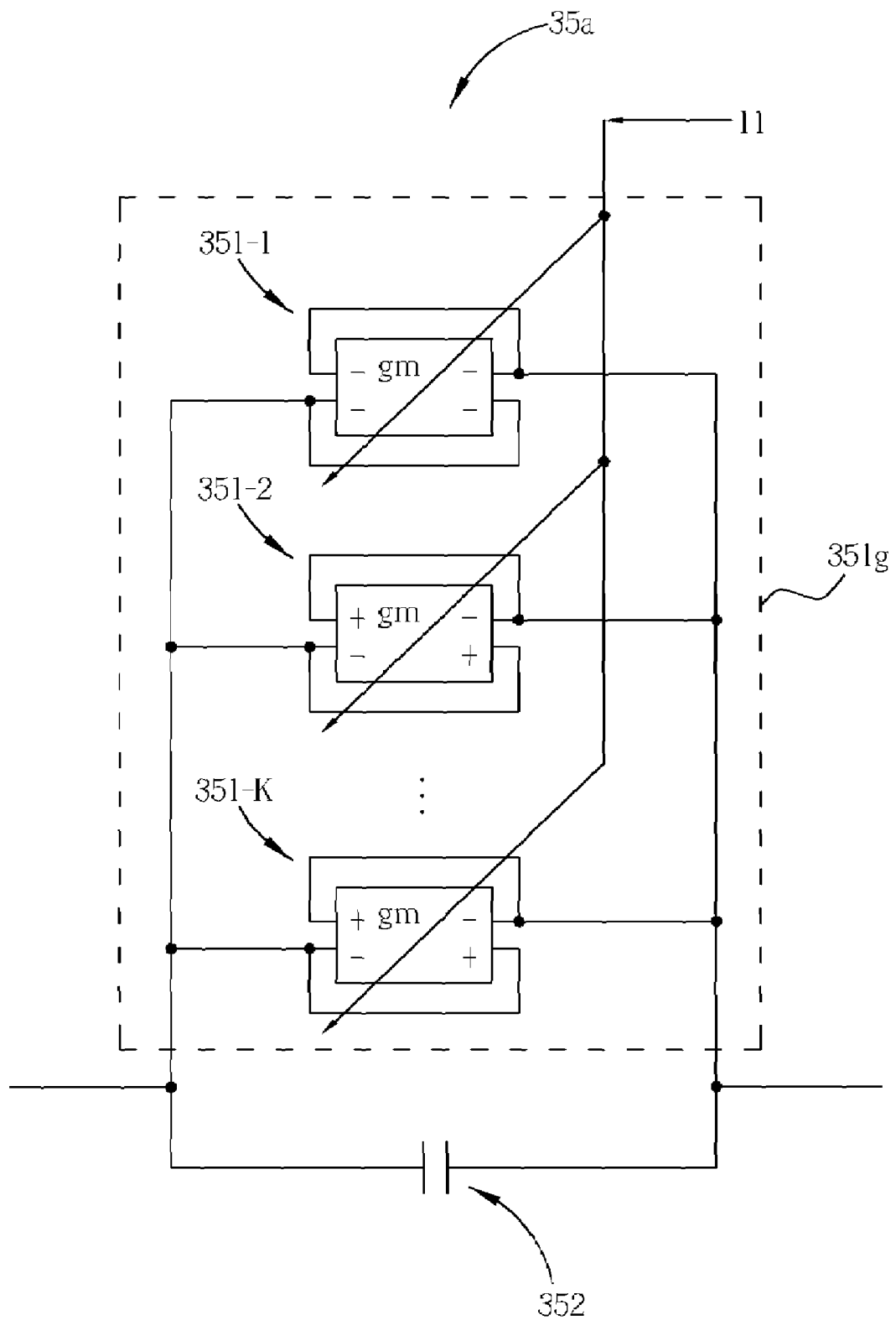
FIG. 3 is a diagram of the impedance shown in FIG. 2.
Figure 4:
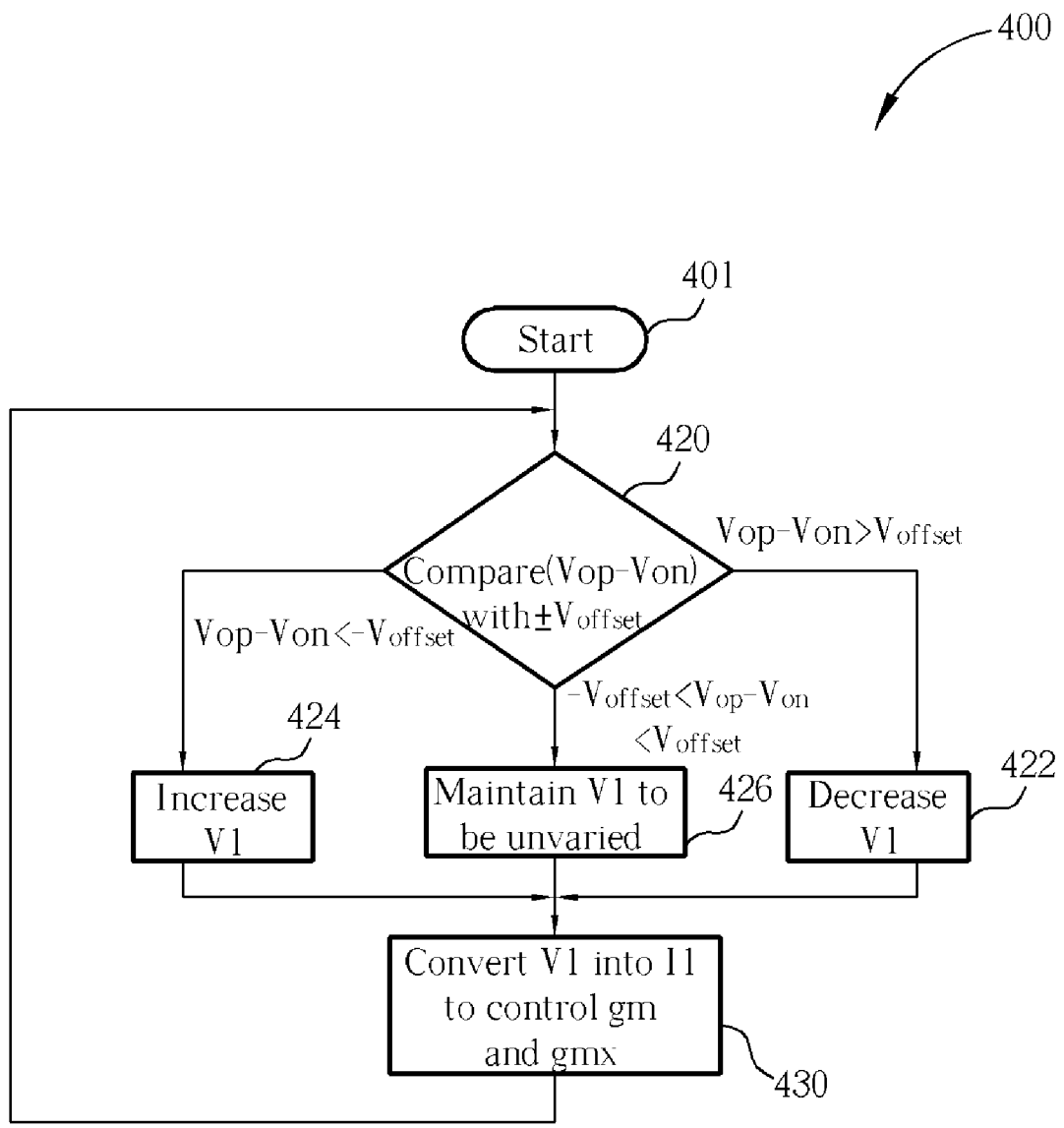
FIG. 4 is a flowchart of a baseline wandering correction method according to one embodiment of the present invention.

Please refer to FIG. 2, FIG. 3, and FIG. 4. FIG. 2 is a diagram of a voltage signal generator according to one embodiment of the present invention, where the architecture shown in FIG. 2 can be applied to the embodiment shown in FIG. 1, and FIG. 3 is a diagram of the impedance 35a shown in FIG. 2. FIG. 4 is a flowchart of a baseline wandering correction method according to one embodiment of the present invention, where the method shown in FIG. 4 can be applied to the embodiment shown in FIG. 2. As shown in FIG. 2, the control circuit 310 comprises two comparators 312 and 314, a charge pump 316, and a voltage-to-current (V/I) conversion circuit 318, where the charge pump 316 and the V/I conversion circuit 318 are well known in the related art, and therefore are not explained in detail herein. Similarly, operations of the current sources 31-34, the two comparators 36-37, and the switches 38-39 of the voltage generation unit 320 are described in U.S. Pat. No. 6,433,608, and therefore are not explained in detail herein. The control circuit 310 and the voltage generation unit 320 mentioned above respectively correspond to the control circuit 212 and the voltage generation unit 214 shown in FIG. 1. Different architecture of the control circuit and the voltage generation unit can be applied to other embodiments of the present invention.

Please refer to FIG. 2 and FIG. 4. The comparator 314 outputs a comparison result S_Vdown according to the reference voltage Voffset and a voltage difference of the output terminals Vop and Von of the receiver 110, where the voltage difference utilized by the comparator 314 can be referred to as (Vop−Von), i.e., the voltage of the output terminal Vop subtracting the voltage of the output terminal Von. In addition, the comparator 312 outputs a comparison result S_Vup according to the reference voltage Voffset and another voltage difference of the output terminals Vop and Von of the receiver 110, where the voltage difference utilized by the comparator 312 can be referred to as (Von−Vop), i.e., the voltage of the output terminal Von subtracting the voltage of the output terminal Vop. The charge pump 316 outputs an output voltage V1 to the V/I conversion circuit 318 according to the comparison result S_Vdown and/or the comparison result S_Vup, where the charge pump 316 decreases a value of the output voltage V1 when the voltage difference (Vop−Von) is greater than the reference voltage Voffset, increases the value of the output voltage V1 when the voltage difference (Von−Vop) is greater than the reference voltage Voffset, and maintains the value of the output voltage V1 when the voltage difference (Vop−Von) falls within the range [−Voffset, +Voffset].

In addition, the V/I conversion circuit 318 receives the output voltage V1 and converts the output voltage V1 into a control current I1 to be outputted to the impedance 35a of the voltage generation unit 320. As shown in FIG. 3, the impedance 35a comprises a capacitor 352 and a current source module 351g, which are arranged in parallel. In this embodiment, the current source module 351g comprises K control current sources 351-1, 351-2, ..., and 351-K, where an input terminal and an output terminal of each control current source are coupled to one terminal of the capacitor 352, and another input terminal and another output terminal of the control current source is coupled to the other terminal of the capacitor 352. The control circuit 310 controls the transconductance value gmx of the compensation current source 220 and a transconductance value gm of each of the control current sources 351-1, 351-2, ..., and 351-K according to the magnitude of the control current I1. The number of control current sources within the current source module 351g can be one or more, when the ratio of an equivalent transconductance value (K*gm) of the current sources 351-1, 351-2, ..., and 351-K that are arranged in parallel to the transconductance value gmx of the compensation current source 220 can be maintained to a predetermined value.

An equivalent resistance value corresponding to the equivalent transconductance value (K*gm) mentioned above is equal to the value Rx in equation (2), and the transconductance value gmx of the compensation current source 220 corresponds to a parameter gmx in equation (2). Therefore, if in equation (1), the value of the parameters Ro or the parameter L of the corresponding stand-alone component varies, the control circuit 310 may adjust the control current I1 according to the variations of the voltage difference (Vop−Von) of the output terminals Vop and Von of the receiver 110, in order to adjust the equivalent transconductance value (K*gm) of the current sources 351-1, 351-2, ..., and 351-K (i.e., to adjust the value Rx mentioned above) and adjust the transconductance value gmx of the compensation current source 220, so as to satisfy the conditions described by equations (1) and (2). As a result, the baseline wandering phenomenon can be effectively corrected. In addition, in this embodiment, even if the conditions described by equations (1) and (2) are not completely satisfied, the baseline wandering phenomenon and side effects thereof can be reduced by a significant degree. As a result, the side effects such as data inaccuracy can be prevented.

Figure 5:
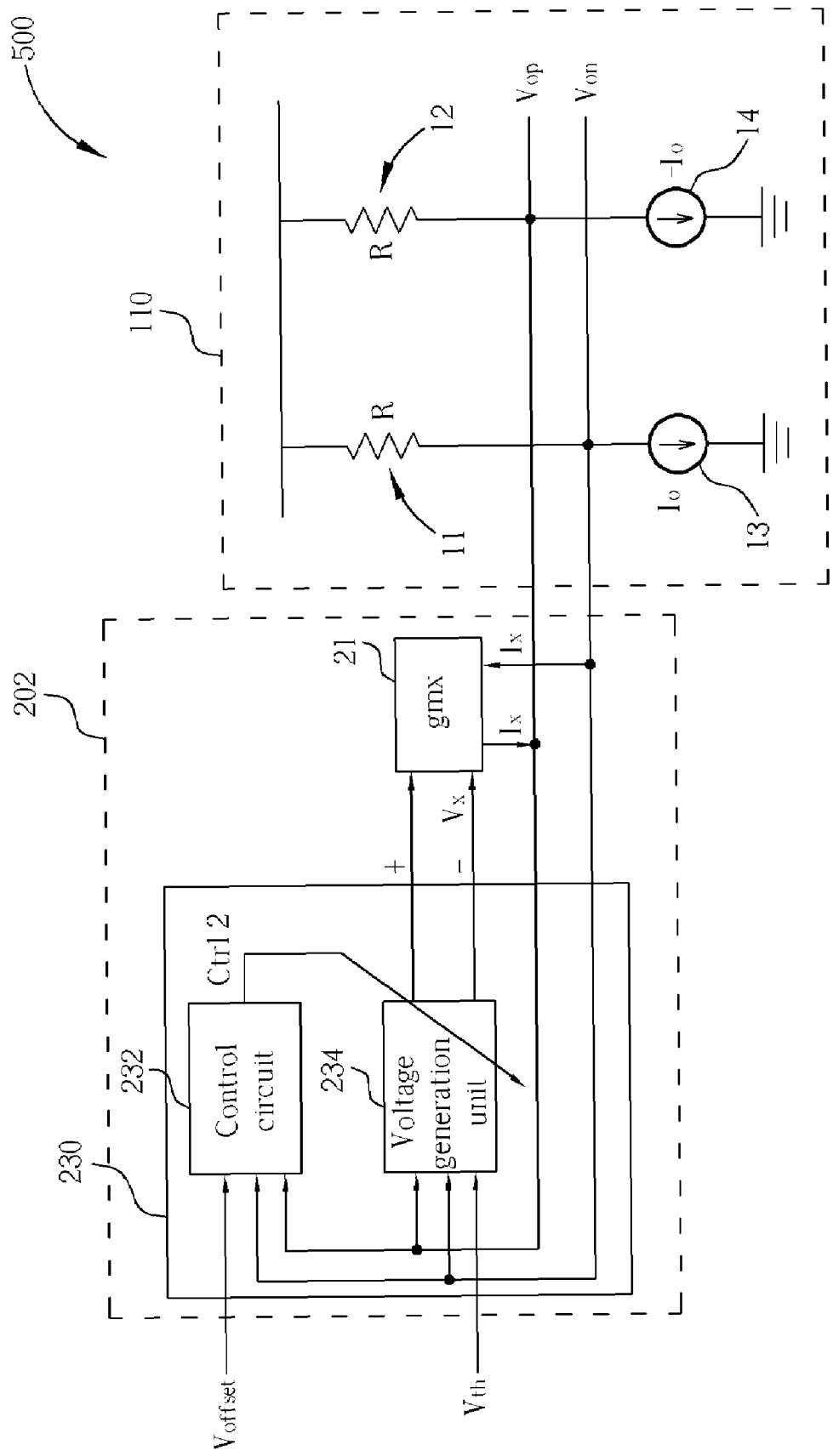
FIG. 5 is a schematic view of a receiving device according to another embodiment of the present invention.

Please refer to FIG. 5. FIG. 5 is a schematic view of a receiving device according to a variant embodiment shown in FIG. 1, where the baseline wandering correction device 202 comprises a compensation current source 21 and a voltage signal generator 230 comprising a control circuit 232 and a voltage generation unit 234. The control circuit 232 outputs a control signal Ctrl2 to the voltage generation unit 234 according to the reference voltage Voffset and the voltages of output terminals Vop and Von, in order to adjust parameter(s) of at least one component in the voltage generation unit 234. The voltage generation unit 234 outputs the control voltage Vx to the compensation current source 21 according to the control signal Ctrl2, the voltages of the output terminals Vop and Von, and the reference voltage Vth. The compensation current source 21 outputs the compensation current Ix to the receiver 110 according to the control voltage Vx to correct the baseline wandering phenomenon.

Figure 6:
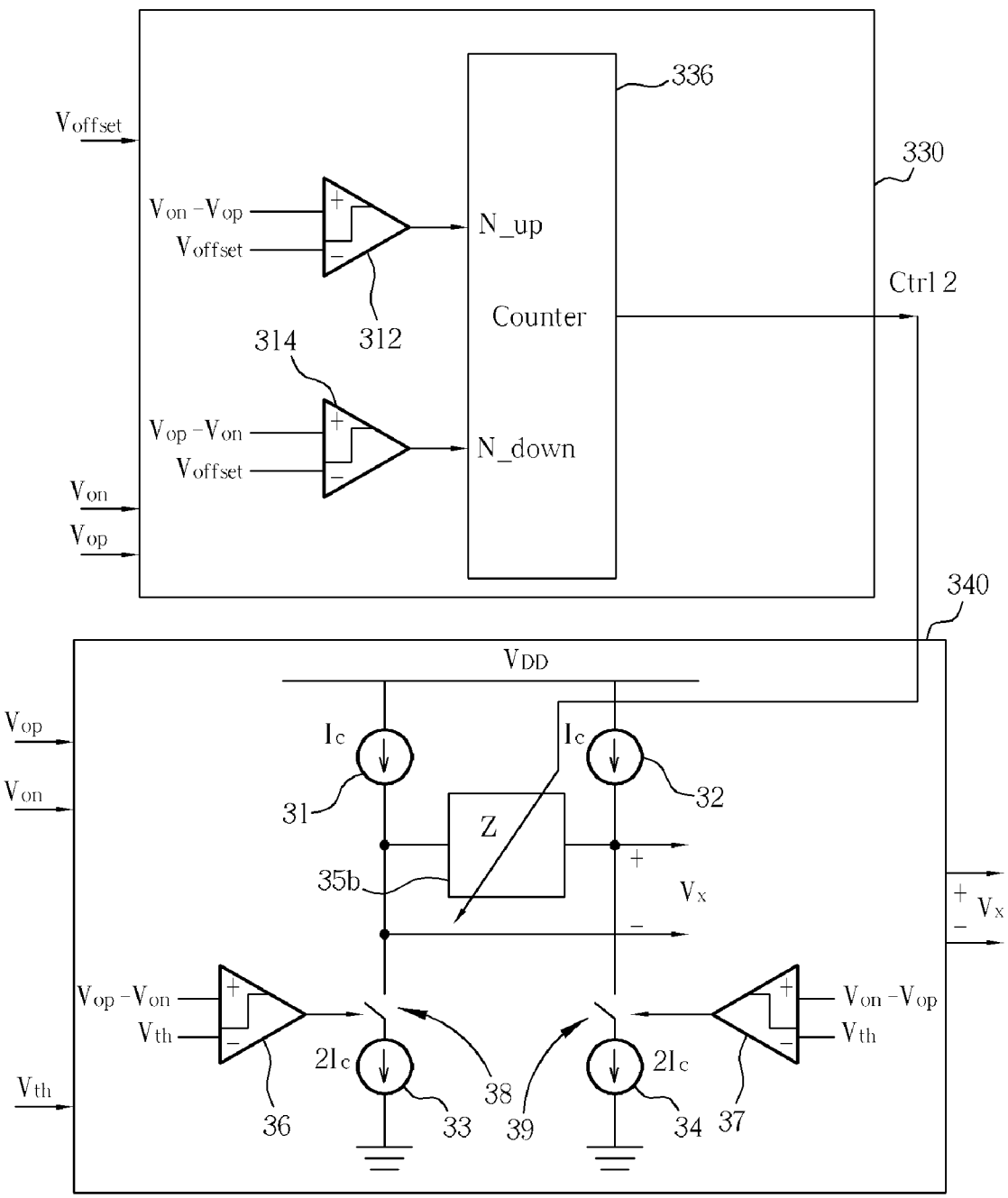
FIG. 6 is a diagram of a voltage signal generator according to another embodiment of the present invention.
Figure 7:
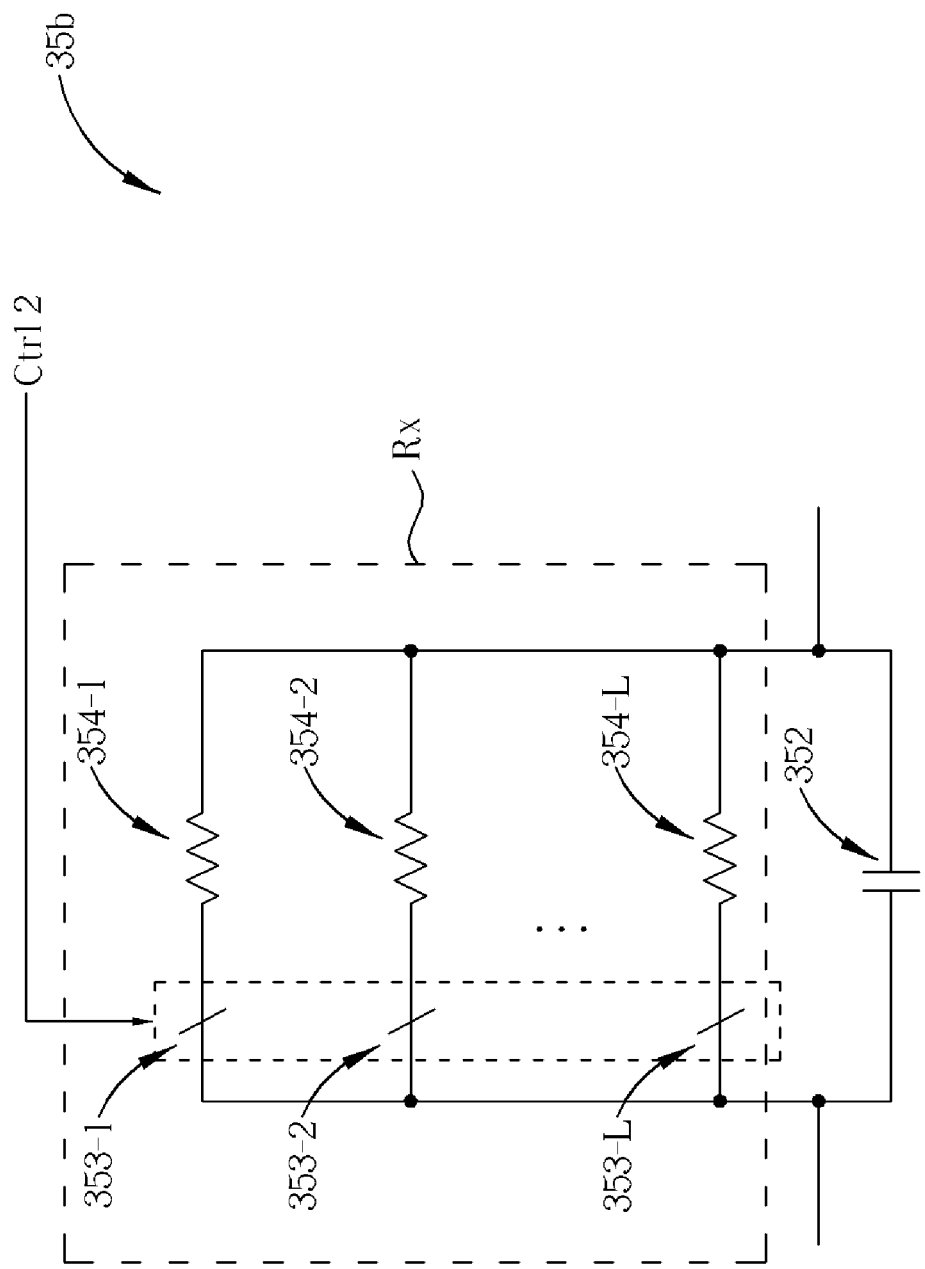
FIG. 7 is a diagram of the impedance shown in FIG. 6.

Please refer to FIG. 6 and FIG. 7. FIG. 6 is a diagram of a voltage signal generator according to another embodiment of the present invention, where the architecture shown in FIG. 6 can be applied to the embodiment shown in FIG. 5, and FIG. 7 is a diagram of the impedance 35b shown in FIG. 6. The control circuit 330 and the voltage generation unit 340 shown in FIG. 6 respectively correspond to the control circuit 232 and the voltage generation unit 234 shown in FIG. 1, where the control circuit 330 comprises the two comparators 312 and 314 as mentioned above and a counter 336. The operations of the two comparators 312 and 314 have been disclosed in the embodiment shown in FIG. 2. The counter 336 is well known in the art, and therefore is not explained in detail herein. Different architecture of the control circuit and the voltage generation unit can be applied to other embodiments of the present invention.

As shown in FIG. 6 and FIG. 7, the counter 336 receives the comparison results respectively outputted by the comparators 312 and 314 through an increase control terminal N_up and a decrease control terminal N_down thereof, and outputs the control signal Ctrl2 (which carries a count value in this embodiment) to the impedance 35b according to at least one of the comparison results. The impedance 35b comprises the capacitor 352 and a variable resistor (the portion with the equivalent resistance value Rx shown in FIG. 7), which are arranged in parallel. In this embodiment, the variable resistor comprises L switching circuits, where each switching circuit comprises a switch 353-J and a resistor 354-J connected in series (J=1, 2, . . . , L). In addition, the control circuit 330 controls the number of switches to be turned on within the switches 353-1, 353-2, . . . , and 353-L by determining the count value that the control signal Ctrl2 carries, in order to control the equivalent resistance value Rx. It is noted that the control circuit 330 merely adjusts the equivalent resistance value Rx without adjusting the transconductance value gmx of the compensation current source 21. In this embodiment, even though the conditions described by equations (1) and (2) are not always completely satisfied, the baseline wandering and the side effects thereof can still be reduced by a significant degree. As a result, the side effects such as the data inaccuracy can be prevented.

In a variation of the embodiment shown in FIG. 5, in order to roughly approach or completely satisfy the conditions described by equations (1) and (2), a digital-to-analog converter can be utilized for converting the count value carried by the control signal Ctrl2 and outputting the converted count value to the compensation current source 21 to adjust the transconductance value gmx of the compensation current source 21, where the product of the transconductance value gmx of the compensation current source 21 and the equivalent resistance value Rx can as a result be maintained a constant.

Figure 8:
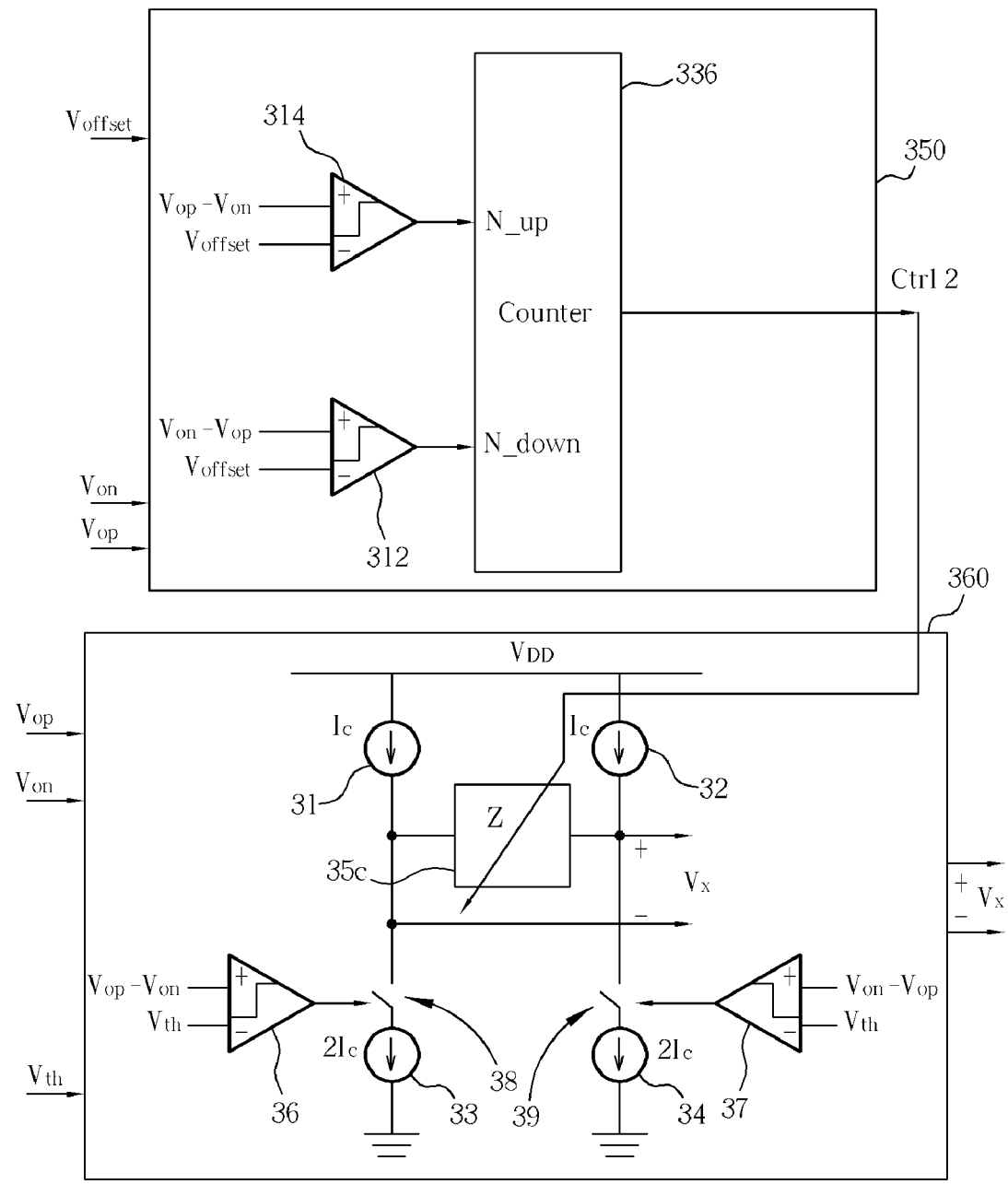
FIG. 8 is a diagram of a voltage signal generator according to yet another embodiment of the present invention.
Figure 9:
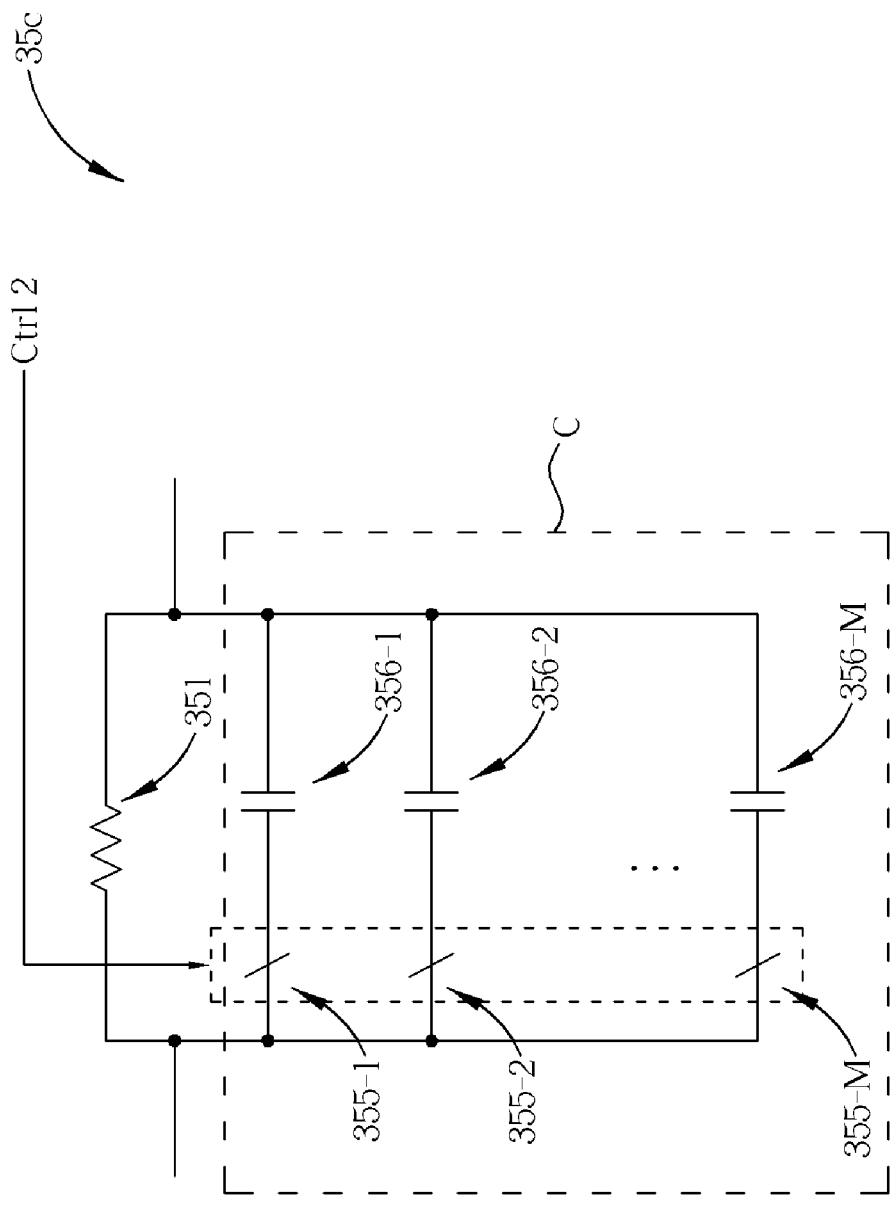
FIG. 9 is a diagram of the impedance shown in FIG. 8.

Please refer to FIG. 8 and FIG. 9. FIG. 8 is a diagram of a voltage signal generator according to yet another embodiment of the present invention, where FIG. 9 is a diagram of the impedance 35c shown in FIG. 8. The control circuit 350 and the voltage generation unit 360 shown in FIG. 8 are similar to those shown in FIG. 6. However, in the control circuit 350 shown in FIG. 8, the comparators 312 and 314 are respectively coupled to the decrease control terminal N_down and the increase control terminal N_up of the counter 336. In addition, the impedance 35c comprises a resistor 351 and a variable capacitor (the portion with the equivalent capacitance value C shown in FIG. 9), which are arranged in parallel. In this embodiment, the variable capacitor comprises M switching circuits, where each switching circuit comprises a switch 355-J and a capacitor 356-J connected in series (J=1, 2, . . . , M). The control circuit 350 controls the number of switches to be turned on within the switches 355-1, 355-2, . . . , and 355-M by determining the count value that the control signal Ctrl2 carries, in order to control the equivalent capacitance value C. As a result, when the parameter Ro or the parameter L in equation (1) varies, the conditions described by equations (1) can be roughly approached or completely satisfied.

Figure 10:
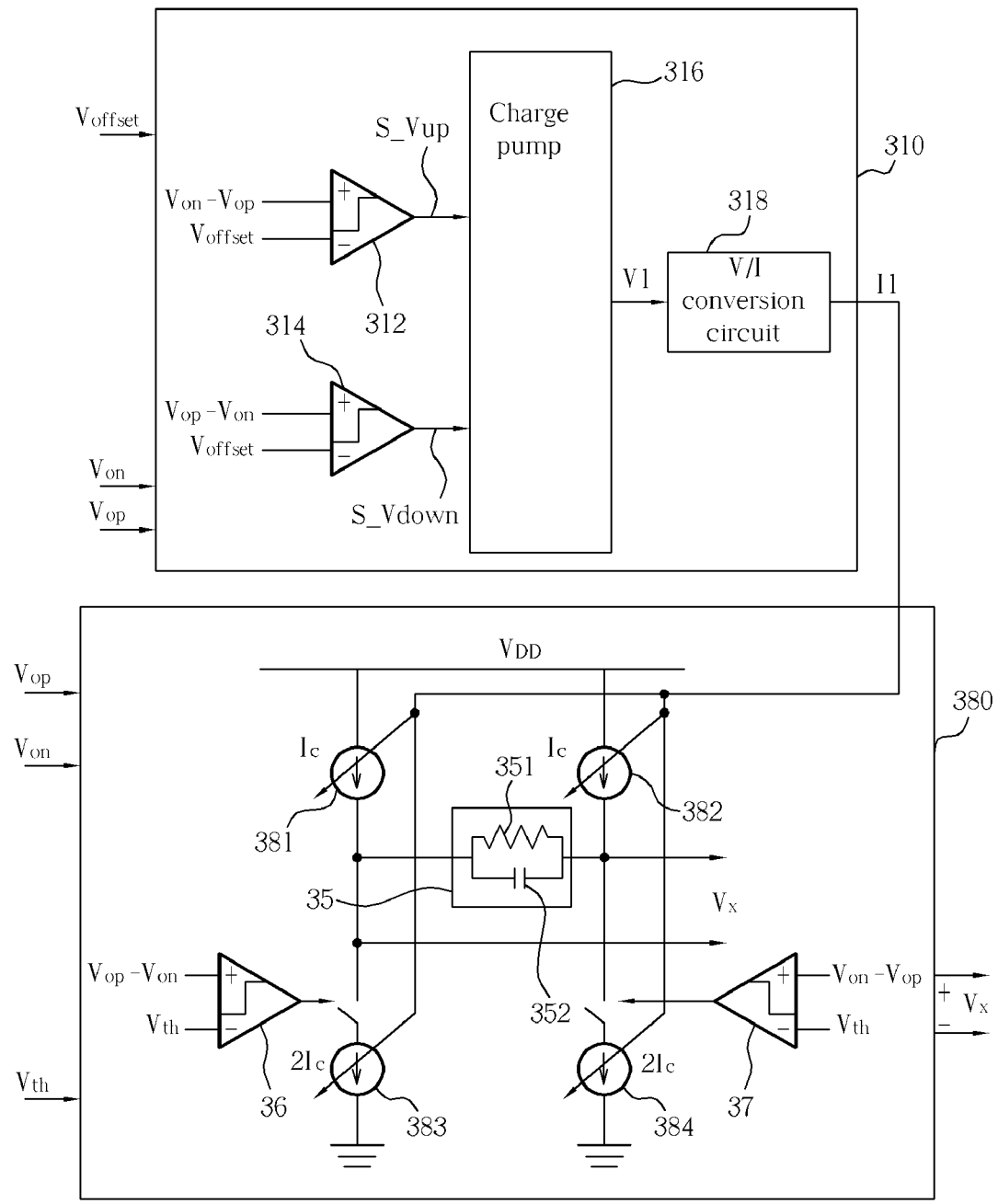
FIG. 10 is a diagram of a voltage signal generator according to yet another embodiment of the present invention.

Please refer to FIG. 10. FIG. 10 is a diagram of a voltage signal generator according to yet another embodiment of the present invention, where the difference between the embodiments respectively shown in FIG. 2 and FIG. 10 is described as follows. The control circuit 310 of the embodiment shown in FIG. 10 adjusts the current value Ic of current sources 381 and 382 and the current value 21c of current sources 383 and 384 to roughly approach or completely satisfy the conditions described by equations (1) and (2), where the current adjustment of the current sources 381, 382, 383, and 384 can be implemented utilizing current mirror architecture.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A baseline wandering correction device for correcting baseline wandering of signals at a first output terminal and a second output terminal of a receiver, comprising:
   a control circuit for outputting a control signal according to voltages of the first and the second output terminals and a second threshold value;
   a voltage generation unit coupled to the control circuit for outputting a control voltage according to the control signal, the voltages of the first and the second output terminals, and a first threshold value; and
   a compensation current source coupled to the voltage generation unit for outputting a compensation current to the receiver according to the control voltage to correct the baseline wandering.

2. The baseline wandering correction device of claim 1, wherein a transconductance value of the compensation current source is adjusted according to the control signal.

3. The baseline wandering correction device of claim 1, wherein the control circuit comprises:
   a comparison circuit for comparing a voltage difference between the voltages of the first and the second output terminals of the receiver with the second threshold value to output at least one comparison result; and
   a signal generation unit coupled to the comparison circuit for outputting the control signal to the voltage generation unit according to the comparison result.

4. A baseline wandering correction method for correcting baseline wandering of signals at a first output terminal and a second output terminal of a receiver, comprising:
   outputting a control signal according to voltages of the first and the second output terminals and a second threshold value;
   outputting a control voltage according to the control signal, the voltages of the first and the second output terminals, and a first threshold value; and
   outputting a compensation current to the receiver according to the control voltage to correct the baseline wandering.

5. The baseline wandering correction method of claim 4, wherein the step of outputting the control voltage further comprises:
   adjusting an impedance value of an impedance according to the control signal; and
   outputting the control voltage according to the voltages of the first and the second output terminals, the first threshold value, and the impedance value.

6. The baseline wandering correction method of claim 5, wherein the impedance comprises at least one of at least one capacitor, at least one resistor, and at least one control current source, and the step of adjusting the impedance value further comprises:
   adjusting at least one of a capacitance value of the capacitor, a resistance value of the resistor, and a transconductance value of the control current source according to the control signal.

7. The baseline wandering correction method of claim 5, wherein the ratio of the compensation current to the control voltage is defined as a compensation current transconductance value, and the ratio of the impedance value of the impedance to the compensation current transconductance value or the product of the impedance value of the impedance and the compensation current transconductance value corresponds to a correction degree of the baseline wandering.

8. The baseline wandering correction method of claim 5, wherein the impedance is coupled to a variable current source, and the product of the impedance value of the impedance and an output current value of the variable current source corresponds to a correction degree of the baseline wandering.

9. The baseline wandering correction method of claim 4, wherein the step of outputting the compensation current further comprises:
adjusting a transconductance value of a compensation current source according to the control signal to output the compensation current.

10. The baseline wandering correction method of claim 4, wherein the step of outputting the compensation in current further comprises:
adjusting at least one output current value of at least one variable current source according to the control voltage; and
outputting the control voltage according to the output current vale, the first threshold value, and the voltage of the first and the second output terminals.

11. The baseline wandering correction method of claim 10, wherein the ratio of the compensation current to the control voltage is defined as a compensation current transconductance value, and the product of the output current value of the variable current source and the compensation current transconductance value corresponds to a correction degree of the baseline wandering.

12. The baseline wandering correction method of claim 4, wherein the step of outputting the control signal further comprises:
comparing a voltage difference between the voltages of the first and the second output terminals of the receiver with the second threshold value to output at least one comparison result; and
outputting the control signal according to the comparison result.

13. A baseline wandering correction device for correcting baseline wandering of signals at a first output terminal and a second output terminal of a receiver, comprising:
a control circuit for outputting a control signal according to voltages of the first and the second output terminals and a second threshold value;
a voltage generation unit coupled to the control circuit for outputting a control voltage according to the control signal, the voltages of the first and the second output terminals, and a first threshold value; and
a compensation current source coupled to the voltage generation unit for outputting a compensation current to the receiver according to the control voltage to correct the baseline wandering;
wherein the voltage generation unit comprises at least one output terminal for
outputting the control voltage to the compensation current source, and an impedance coupled to the output terminal and the control circuit, an impedance value of which is adjusted according to the control signal.

14. The baseline wandering correction device of claim 13, wherein the impedance comprises:
at least one of at least one capacitor, at least one resistor, and at least one control current source;
wherein at least one of a capacitance value of the capacitor, a resistance value of the resistor, and a transconductance value of the control current source is adjusted according to the control signal.

15. The baseline wandering correction device of claim 13, wherein the ratio of the impedance value of the impedance to a transconductance value of the compensation current source or the product of the impedance value of the impedance and the transconductance value of the compensation current source corresponds to a correction degree of the baseline wandering.

16. The baseline wandering correction device of claim 13, wherein the voltage generation unit further comprises:
a current source coupled to the impedance, the ratio of the impedance value of the impedance to an output current value of the current source or the product of the impedance value of the impedance and an output current value of the current source corresponds to a correction degree of the baseline wandering.

17. A baseline wandering correction device for correcting baseline wandering of signals at a first output terminal and a second output terminal of a receiver, comprising:
a control circuit for outputting a control signal according to voltages of the first and the second output terminals and a second threshold value;
a voltage generation unit coupled to the control circuit for outputting a control voltage across a first control node and a second control node, according to the control signal, the voltages of the first and the second output terminals, and a first threshold value; and
a compensation current source coupled to the voltage generation unit for outputting a compensation current to the receiver according to the control voltage to correct the baseline wandering;
wherein the voltage generation unit comprises an impedance coupled to the compensation current source, and at least one variable current source coupled to the control circuit and the impedance, and between the first control node and the second control node, for outputting a current to the impedance to generate the control voltage, at least one output current value of the at least one variable current source being adjusted according to the control signal.

18. The baseline wandering correction device of claim 17, wherein the product of the output current value of the variable current source and a transconductance value of the compensation current source corresponds to a correction degree of the baseline wandering.

19. The baseline wandering correction device of claim 17, wherein the product of the output current value of the variable current source and an impedance value of the impedance or the ratio of the output current value of the variable current source to an impedance value of the impedance corresponds to a correction degree of the baseline wandering.

20. A baseline wandering correction device for correcting baseline wandering of signals at a first output terminal and a second output terminal of a receiver, comprising:
a control circuit for outputting a control signal according to voltages of the first and the second output terminals and a second threshold value;
a voltage generation unit coupled to the control circuit for outputting a control voltage according to the control signal, the voltages of the first and the second output terminals, and a first threshold value; and
a compensation current source coupled to the voltage generation unit for outputting a compensation current to the receiver according to the control voltage to correct the baseline wandering;
wherein the compensation current source further receives the control signal, and a transconductance value of the compensation current source is adjusted according to the control signal.

* * * * *